United States Patent [19]

Nakasone

[11] 4,152,607
[45] May 1, 1979

[54] SOFT SWITCH WITH RAPID RECOVERY CIRCUIT

[76] Inventor: Henry H. Nakasone, 1672 Camrose Way, Anaheim, Calif. 92802

[21] Appl. No.: 768,547

[22] Filed: Feb. 14, 1977

[51] Int. Cl.² ............................................. H03K 17/00
[52] U.S. Cl. ............................ 307/252 B; 307/252 N; 307/293; 315/194
[58] Field of Search ............... 307/262, 252 B, 252 N, 307/252 D, 293; 315/194

[56] References Cited

U.S. PATENT DOCUMENTS

| | | | |
|---|---|---|---|
| 3,582,684 | 6/1971 | Gregson | 307/252 N |
| 3,898,516 | 8/1975 | Nakasone | 315/194 |
| 3,991,343 | 11/1976 | Delpy | 307/252 N |
| 4,008,416 | 2/1977 | Nakasone | 307/252 N |

*Primary Examiner*—Stanley D. Miller, Jr.
*Assistant Examiner*—B. P. Davis
*Attorney, Agent, or Firm*—Bruce D. Jimerson

[57] ABSTRACT

The specification discloses an improved circuit for effecting a gradual change in conduction angle during "turn-on" and a rapid recovery to the quiescent "off-state" following gradual "turn-off". Both the "turn-on" and "turn-off" characteristics are achieved by using a single accumulating capacitor.

8 Claims, 13 Drawing Figures

SOFT SWITCH WITH RAPID RECOVERY CIRCUIT

BACKGROUND OF THE INVENTION

Cross Reference to Related Patents and Patent Applications

Reference is made to the following Patent and Patent application:

U.S. Pat. No. 3,898,516 entitled Lighting Control System For Incandescent Lamps filed May 29, 1973 by Henry H. Nakasone and Application Ser. No. 595,585 now U.S. Pat No. 4,008,416, Feb. 15, 1977 entitled Circuit for Producing a Gradual Change in Conduction Angle filed July 14, 1975 by Henry H. Nakasone. The contents of each are incorporated herein by reference for the purpose of providing additional background information.

Reference is also made to a Patent Application entitled, "Momentary Contact Light Switch" by Henry H. Nakasone and Bruce D. Jimerson, Ser. No. 768,544 filed concurrently herewith.

DESCRIPTION OF THE PRIOR ART

Although the above referred to Patent and Patent Application No. 595,585 now U.S. Pat. No. 4,008,416, Feb. 14, 1977 describe circuits which produced a gradual "turn-on" and a gradual "turn-off," they were deficient in several respects. Thus, in those embodiments which utilized a thermister, an immediate reactivation of the switch following gradual "turn-off" would cause the initial conduction angle to be larger than it would be if the thermister were allowed to return to its normal room temperature. An additional problem with using an uncompensated thermister resulted from the fact that the initial conduction angle is dependent upon the ambient room temperature—a highly undesirable situation in areas likely to be subjected to large temperature excursions. In the prior art circuits utilizing an accumulating capacitor, it was necessary to employ a separate set of contacts for its discharge in order to achieve rapid recovery. Moreover, if a separate blocking capacitor were used to effect gradual turnoff, the peak value of the A.C. voltage would be impressed across the capacitor in the "off" state. What is actually desired, therefore, is a circuit for effecting a gradual "turn-on" and a delayed "turn-off" which requires only a single low voltage capacitor to obtain the respective delays.

Accordingly, a primary object of the invention is to provide a circuit for gradually applying power to an incandescent lamp or other electrical apparatus which utilizes a single capacitor to effect both gradual "turn-on" and delayed "turn-off."

A further object of the invention is to provide a circuit for gradually applying power to an incandescent lamp or other electrical apparatus which can be rapidly reactivated following a delayed turn-off.

A further object of the invention is to provide a circuit for gradually applying power to an incandescent lamp or other electrical apparatus which is not dependent upon the ambient temperature.

Another object of the invention is to provide a circuit which will gradually discharge the "turn-off" delay determining capacitor until the load current is extinguished, and rapidly discharge the "turn-off" delay determining capacitor thereafter.

Another object of the invention is to provide a gradual "turn-on" circuit which will automatically increase to a point where the total conduction angle approaches 360°.

An additional object of one embodiment is to provide double phase shifting networks to reduce the initial "turn-on" surge and increase the total conduction time during the quiescent "on" state.

Another object of the invention is to provide a system for producing a soft "turn-on" and a delayed "turn-off" from either of two remote locations utilizing existing three-way household wiring.

Other objects and advantages of the present invention will be obvious from the detailed description of a preferred embodiment given herein below.

SUMMARY OF THE INVENTION

The aforementioned objects are realized by a circuit which produces both gradual "turn-on" and delayed "turn-off." The control element comprises a triac whose conduction angle is dependent upon the charge of an accumulating capacitor. The accumulating capacitor is connected to a phase shifting capacitor via a diode arrangement which varies the phase of the voltage at the gating terminal of the triac as an inverse function of the potential to which the accumulating capacitor has been charged. To effect gradual "turn-on," a gating switch is closed causing the charge on the accumulating capacitor to be incremented during each positive half cycle. To affect gradual "turn-off," the gating switch is opened causing the charge on the accumulating capacitor to be decremented during each negative half cycle. Unwanted discharge of the accumulating capacitor from the negative half cycle during "turn-on" and during the steady state "on" condition is prevented by a neon indicator lamp.

During "turn-off," a series connected diode prevents application of the positive half cycles to the accumulating capacitor and gating circuitry. At the instant the gating switch is opened therefore, the triac conducts only during the negative half cycle (and hence the power applied to any series connected load is reduced by approximately 50%). Each negative half cycle decreases the charge on the accumulating capacitor which gradually reduces the conduction angle until the amplitude of the voltage across the neon exceeds its breakdown potential, at which point the accumulating capacitor is rapidly discharged to zero volts, bringing the circuit to the quiescent "off-state" in readiness for gradual "turn on"—which is accomplished by closure of the gating switch.

Special embodiments include double phase shifting circuits in which the phase delay of both circuits is varied to reduce the initial turn-on 1stocc. surge and increase the "on" 2ndocc. state conduction angle and special adaptations for producing gradual "turn-on" and delayed "turn-off" from either of two locations.

DESCRIPTION OF THE DRAWINGS

FIG. 2A shows the waveform of the voltage across a–k immediately following closure of the gating switch.

FIG. 2B shows the waveform of the voltage across a–k three seconds after closure of the gating switch.

FIG. 2C shows the waveform of the voltage across a-k eight seconds after closure of the gating switch.

FIG. 2D shows the waveform of the voltage across a-k at the instant that the gating switch is opened.

FIG. 2E shows the waveform of the voltage across a-k at six seconds after the gating switch has been opened.

FIG. 2F shows the waveform of the voltage across a-k seven seconds after the gating switch has been opened.

DETAILED DESCRIPTION OF A PREFERRED EMBODIMENT

Figure 1:
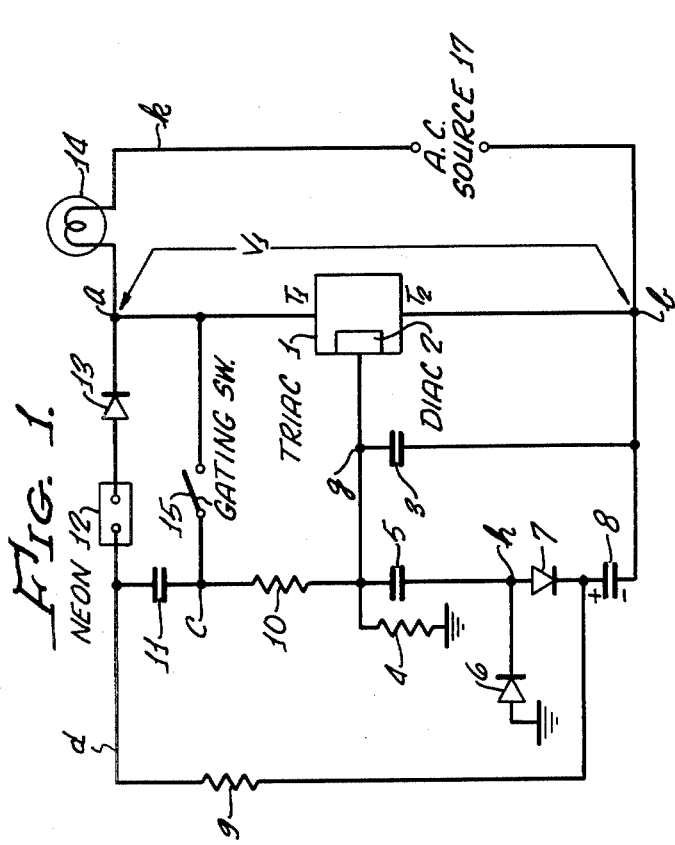
FIG. 1 shows a schematic diagram of a preferred embodiment of the invention.

Adverting to the drawings, and particularly FIG. 1, a preferred embodiment of the invention comprises a triac 1 having its main terminals $T_1$ and $T_2$ connected in series with a load 14 (typically an incandescent light bulb) and an A-C power Source 17. The gate terminal "g" of triac 1 connects the internal bidirectional breakdown diode 2 (commonly known as a diac) with a firing capacitor 3, phase shifting capacitor 5 and discharge resistor 16. The other terminal of Capacitor 5 is connected to the cathode of diode 6 and the anode of diode 7. Accumulating capacitor 8 is charged through diode 7, and discharged through resistor 9. The neon 12, diode 13 and capacitor 11 function in conjunction with the state of the gating switch 15 to charge or discharge the accumulating capacitor 8.

In order to understand the operation of the circuit, it will be assumed that the charge on accumulating capacitor 8 is zero at the time $T_0$ when gating switch 15 is first closed. When gating switch 15 is closed, the A-C source is impressed across the junctions c-b. The voltage at "g" will be shifted approximately 90° with respect to the voltage across c-b as a result of capacitor 5. Resistor 10 is chosen so that the amplitude of the waveform at "g" is sufficient to breakdown diac 2 late in the A-C cycle as indicated by the hatched area of FIG. 2A. It will be observed that no isolation resistor is utilized between capacitor 5 and capacitor 3 to prevent an early firing of the diac as described in Patent Application No. 595,585. The need for such isolation is obviated by the diodes 6 and 7 which prevent discharge of capacitor 5 after diac 2 breaks down.

Figures 2A, 2B, 2C, 2D, 2E, 2F:
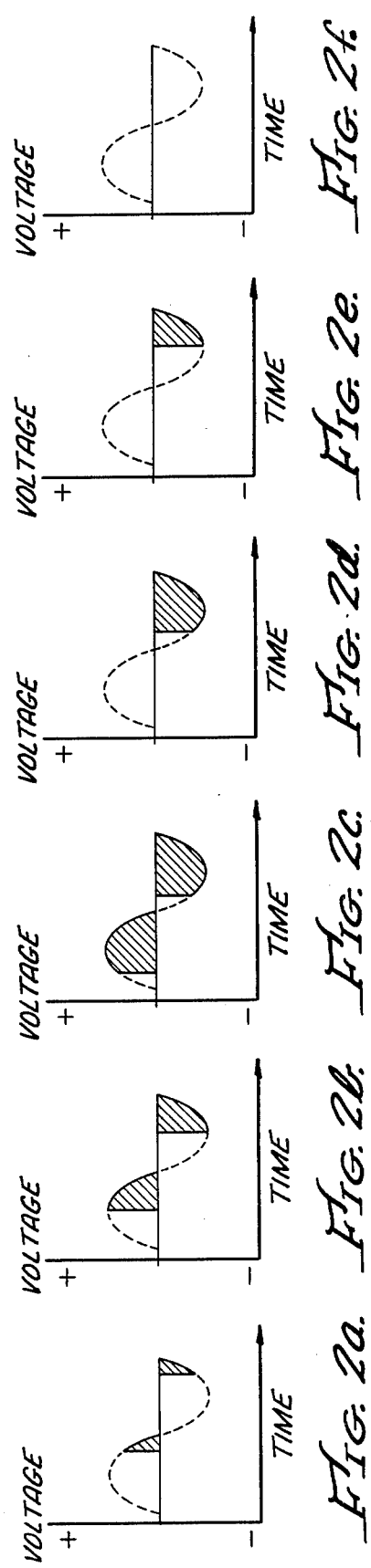
FIGS. 2A–2F show the waveforms $V_1$ which appear across the load points (a–k) of FIG. 1 at various stages during gradual "turn-on" and "turn-off" as follows.

At time $T_1$, three seconds have passed and the charge on accumulating capacitor 8 has risen to a point such that the diac 2 breaks down approximately halfway through the conduction cycle as depicted in FIG. 2B. At Time $T_2$ (8 seconds after closure of switch 15) capacitor 8 has charged to a point such that the Triac 1 conducts during approximately 90% of the input A-C cycle as shown in FIG. 2C.

An understanding of how the charge on accumulating capacitor 8 increases the conduction angle is obtained by noting that the impedance presented by diodes 6 and 7 is high until the potential at point "h" reaches the potential to which accumulating capacitor 8 has been charged. Thereafter, the increase in voltage at junction "g" is determined by the rate at which capacitor 5 charges through resistor 10. As accumulating capacitor 8 continues to charge through diode 7 during each positive half cycle, the delay produced by capacitor 5 is decreased. Diac 2 thus breaks down progressively earlier with each cycle. Thus, at Time $T_2$, the voltage waveform across the load is approximate as shown in FIG. 2C indicating a conduction cycle of approximately 170°, the circuit having reached the quiescent "on-state" where no further increase in conduction angle is possible due to the phase delay produced by capacitor 3. It will be noted that during the gradual "turn-on," gating switch 15 has been closed, so that the voltage at junction "a" is applied through coupling capacitor 11 to junction "d". As a consequence, neon 12 will not conduct until gating switch 15 is opened.

Opening of the gating switch 15 initiates the "turn-off" process. The power applied to the load 14 immediately drops by 50% since the triac 1 no longer conducts during the positive half cycle. The negative half cycle however, causes neon 12 to conduct whenever the algebraic sum of the voltage on accumulating capacitor 8 and the voltage across a-b exceeds its breakdown potential (typically 120 volts). Thus, if accumulating capacitor 8 has charged to approximately 100 volts during the quiescent "on" state, neon 12 will breakdown early during the negative half cycle of the A-C source.

When neon 12 conducts, the voltage at junction "d" abruptly changes. This abrupt change is transferred via coupling capacitor 11 to junction "g" causing triac 1 to conduct so that the voltage across a-b is extinguished. During the remaining portion of the negative half cycle and the following positive half cycle, neon 12 is cut-off, and capacitor 11 is recharged through resistor 9 to a positive potential—thus incrementally reducing the charge on accumulating capacitor 8. During the next negative half cycle, neon 12 again conducts; but at a slightly later phase time due to the slight decrease in the positive potential at junction "d". It will be noted therefore, that the discharge of accumulating capacitor 8 proceeds slowly (as determined by the values of resistor 9 and coupling capacitor 11) as long as the abrupt change produced by conduction of neon 12 is sufficient to cause triac 1 to conduct. It will be understood, however, that as capacitor 8 continues to discharge, a point will be reached where the voltage pulse transmitted by capacitor 11 will be inadequate to charge capacitor 5 to a voltage sufficient to breakdown diac 2. When this occurs, the triac 1 no longer conducts, and power to the load 14 is extinguished. As soon as this occurs neon 12 conducts for a considerably greater portion of the negative half cycle (until the instantaneous amplitude of the AC source drops below the conducting potential of the neon 12) thus rapidly discharging the accumulating capacitor 8 to zero volts.

Resistor 9 is preferably selected to produce a 6 to 8 second delay between the time gating switch 15 is opened, and the time at which the load power is fully cut off. If Resistor 9 is chosen as 82k, the time within which the circuit can be reactivated is approximately three seconds after the load power is cut off. FIG. 2D indicates the voltage waveforms across the load at time $T_3$ when gating switch is opened, and FIG. 2E indicates the voltage waveform at time $T_4$ just prior to extinguishment of load current. FIG. 2F shows the voltage waveform at time $T_5$ when triac 1 ceases to conduct.

Figure 3:
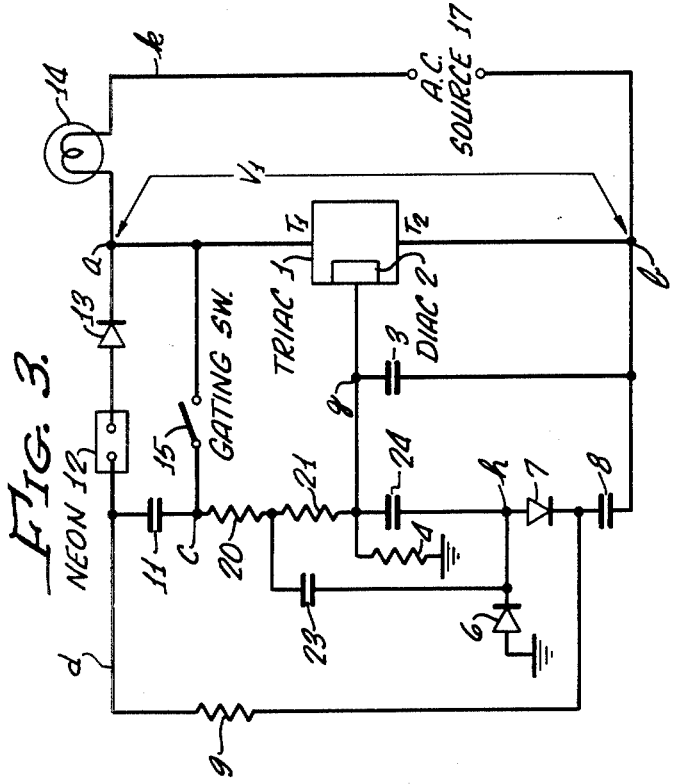
FIG. 3 shows a schematic diagram of an alternative embodiment of that shown in FIG. 1.

FIG. 3 shows an alternative embodiment of the invention in which resistor 10 has been replaced with two resistors, 20 and 21 (having a combined resistance approximately equal to that of resistor 10) which are series connected at junction "j". A capacitor 23 is connected between junction "j" and the junction "h". The only other change is in the value of the capacitor (labeled as 23 in FIG. 3) between junction "g" and junction "h" as indicated. Although the number of components is increased, two important advantages are realized. The first advantages results from the double integrating effect of the two separate phase shifting networks $R_{20}$–$C_{23}$ and $R_{21}$–$C_{24}$ during the time immediately following closure of the gating switch 15. With a single integrating circuit (as in FIG. 1) the triac 1 will initially conduct at a phase angle which lags the zero crossover of the A-C source by approximately 135 degrees. The initial current pulse is therefore approximately one-half the amplitude of that which would result if the initial conduction occurred at 90° (at the peak of the A-C source). With double phase shifting, the resistors $R_{20}$ and $R_{21}$ can be chosen such that the voltage at junction "g" is still rapidly rising through the amplitude at which diac 2 breaks down at the time that the A-C source approaches the 180° crossover point. As a consequence the triac 1 initially conducts when the amplitude of the A-C source is very low, and the initial load current pulse is reduced accordingly.

Although the double time constant circuits discussed in the aforementioned patent application (Ser. No. 595,585) also effect double integration, they have the disadvantage of producing an additional delay which limits the maximum conduction time during the quiescent "on" phase. The second important advantage of the configuration shown in FIG. 3 lies in the fact that it actually enhances the conduction angle during the quiescent "on" state rather than decreasing it. This results from the fact that, as accumulating capacitor 8 charges, the junction "h" "floats" between zero volts and the potential to which accumulating capacitor 8 has been charged. In essence, junction "g" is driven through resistor $R_{20}$, capacitor $C_{23}$ and capacitor $C_{24}$ which produce no phase shift until the swing at junction "h" exceeds the above referred to limits. With accumulating capacitor 8 fully charged, the only delay is produced by firing capacitor 3. Since resistor $R_{20}$ is less than resistor 10, the time required to charge the firing capacitor 3 to a voltage sufficient to breakdown diac 2 is reduced.

Figure 4:
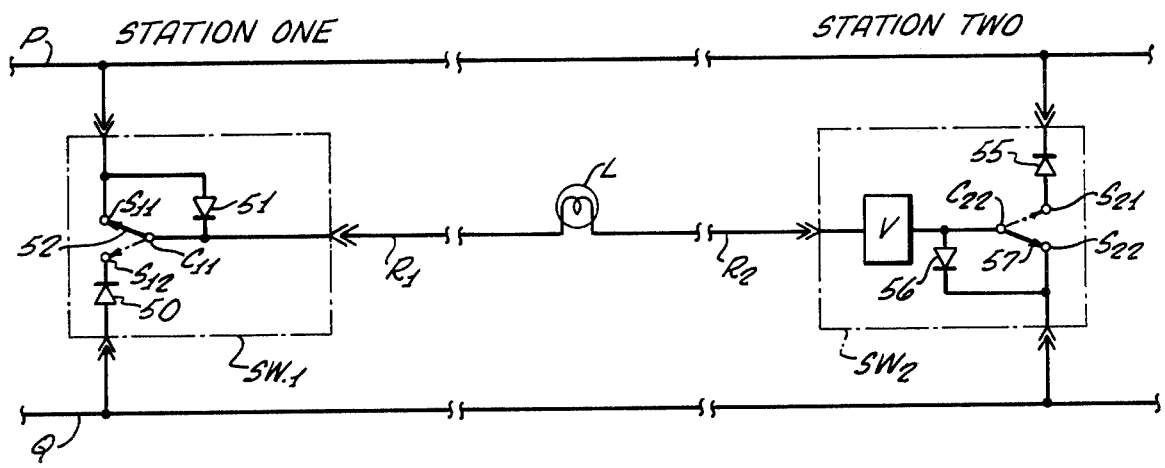
FIG. 4 shows a diode switching configuration for achieving gradual "turn-on" and delayed "turn-off" from either of two remote stations using no other interconnecting wiring than that which is normally installed in a conventional three-way household wiring system.
Figure 5:
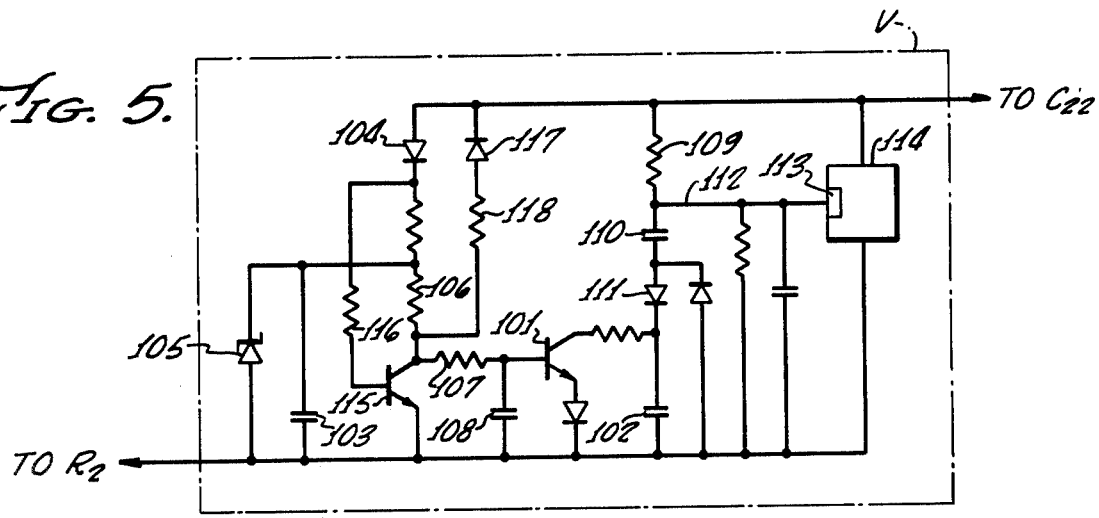
FIG. 5 shows an adaptation of the basic soft switch controller suitable for achieving gradual "turn-on" and delayed "turn-off" using the diode switching configuration of FIG. 4.
Figure 6A:
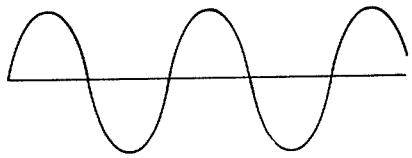
FIGS. 6A, 6B and 6C show the three voltage waveforms that are produced by the diode switching configuration of FIG. 4.
Figure 6B:
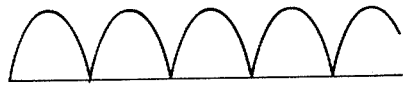
Figure 6C:
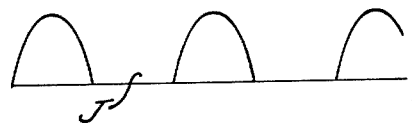

The switching system shown in FIG. 4 provides a unique arrangement for achieving gradual "turn-on" and delayed "turn-off" from two locations using conventional existing wiring. The existing A-C lines P and Q between stations one and two are connected to the switch units $SW_1$ and $SW_2$ in the same manner as a conventional three-way switch. Switch unit $SW_1$ includes a pair of diodes, 50 and 51, which are internally connected to the terminals $C_{11}$, $S_{11}$, $S_{12}$ of switch 52 as indicated. Switch 52 can be moved to connect line R to terminal $S_{11}$ (the AC voltage on line P as indicated in FIG. 6A) or terminal $S_{12}$ (so that $C_{11}$ is impressed with a full wave rectified voltage as indicated in FIG. 6B. Switch unit $SW_2$ is comprised of diodes 55, 56, switch 57 and a modified version "V" of the soft switch controller, the circuit details of which are shown in FIG. 5. Soft switch controller "V" is series connected between the line R and the terminal $C_{22}$ of toggle 57. The series elements (lamp "L" and soft switch controller "V") are thus subjected to three separate wave forms, as follows:

| | | |
|---|---|---|
| I | $C_{11}$ is connected to $S_{11}$ and $C_{22}$ is connected to $S_{22}$ | The series combination of L and "V" is impressed with an A-C voltage as shown in FIG. 6A. |
| | when: | |
| II | $C_{11}$ is connected to $S_{12}$ and $C_{22}$ is connected to $S_{21}$ | The series combination of V and L is impressed with a full wave rectified voltage as shown in FIG. 6B. |
| | when: | |
| III | $C_{11}$ is connected to $S_{11}$ and $C_{22}$ is connected to $S_{21}$ or $C_{11}$ is connected to $S_{12}$ and $C_{22}$ is connected to $S_{21}$ | The series combination of V and L is impressed with a half wave rectified voltage as shown in FIG. 6C. |

The problem posed, therefore, is that of effecting gradual "turn-on" whenever either switch unit $SW_1$ or $SW_2$ is changed to produce a change in state from III to either I or II, and to effect gradual "turn-off" whenever either $SW_1$ or $SW_2$ is changed to produce a change in state from I or II to III. These objectives are realized by the circuit shown in FIG. 5 in which the transistor 101 discharges capacitor 102 whenever the voltage waveform of FIG. 6C is impressed across "V" and "L". This function is accomplished by charging capacitor 103 through diode 104 during each positive half cycle—to a maximum potential equal to the breakdown voltage of zener 105. During the non-conducting period (indicated as J in FIG. 6C) the charge on capacitor 103 leaks off through resistor 106 and 107 to raise the potential of capacitor 108 to a point sufficient to cause transistor 101 to conduct. Each time that transistor 101 conducts, capacitor 102 is incrementally discharged. Thus, if capacitor 102 is initially at zero volts, it will remain discharged. Similarly, if capacitor 102 has been progressively charged vis-a-vis resistor 109, capacitor 110, and diode 111 (by the process previously discussed) it will be incrementally discharged each time transistor 101 conducts. For reasons to be discussed below, the values of 106, 107 and 108 should be chosen so that the potential on capacitor 108 will rise to a point sufficient to cause 101 to conduct approximately midway between the rectified half wave cycles shown in FIG. 6C.

In summary, therefore, the discharge of capacitor 102 is maintained in State III so that the voltage at the gate terminal 112 does not rise to a level sufficient to breakdown disc 113. As a consequence, a change from State I or II to State III will cause triac 114 to conduct for a progressively shorter duration each half cycle until it is completely cut off by the total discharge of capacitor 102.

If the position of switch 52 or 57 is changed to bring the system to state I or II, capacitor 102 progressively charges until the quiescent "on" condition is achieved. Thus, if the change is from State III to State I (FIG. 6A), the positive portion of the A-C cycle causes transistor 115 to conduct by virtue of the current flowing in resistor 116—thus maintaining capacitor 108 discharged so as to prevent "turn-on" of transistor 101. During the negative half cycle, capacitor 108 is discharged through diode 117, resistor 118 and resistor 107. If the system is instead changed from State III to State II (FIG. 6B), the full wave rectified pulses cause transistor 115 to conduct each half cycle. It will be noted that in either State I or II the effect of the increased charge on capacitor 102 will be to reduce the time that the voltage appears across circuit "V", i.e., the increasing conduction angle of triac 114 shorts out "V" for progressively greater durations each half cycle. Were it not for diode 117 and resistor 118, capacitor 108 would commence charging as soon as triac 114 conducts. Diode 117 and resistor 118, however, prevent capacitor 108 from being charged by capacitor 103 after transistor 115 stops conducting due to the firing of triac 114. The values of 106, 107 and 108 can thus be chosen to assure reliable conduction of 101 midway between the half wave rectified cycles (State III) while at the same time totally preventing conduction of 101 when the system is in State I or II.

The present invention has been shown and described with reference to circuits which produce results not possible with prior art configurations for accomplishing gradual "turn-on" and "turn-off." The elimination of capacitors which are impressed with the full line voltage during the "off" state, and the utilization of a common capacitor to achieve gradual "turn-on" and delayed "turn-off" are decidedly advantages. In addition, the present invention is the only circuit which can be reactivated within 2 to 3 seconds following the delayed "turn-off". In some applications, the neon itself can be built into the switch to provide a continuous light source to aid in finding the switch at night. Thus, although each of the disclosed improvements derive from the particular circuit shown, it will be understood that the basic concepts are not limited thereto, and that certain changes, modifications and substitutions may be made without departing from the spirit of the invention.

What is claimed is:

1. An apparatus for producing a gradual change in the power applied to a load comprising:
   a solid state switching device having anode and cathode main terminals and a gate terminal means for altering the impedance between said main terminals from a high impedance state to a low impedance state;
   means for connecting the main terminals of said solid state switching device in series with a load and an A-C power source;
   a gating switch having a first terminal operative connected to the anode of said solid state switching device, said gating switch having a closed position and an open position;
   an accumulating capacitor;
   rectifying means connected in series with said accumulating capacitor for progressively increasing the charge on said accumulating capacitor when said gating switch is changed from the open position to the closed position;
   phase shifting means operatively connected to a second terminal of said gating switch and said gate terminal of said solid state switching device for delaying the phase time at which the magnitude of the voltage applied to said gate terminal is sufficient to cause the impedance between the main terminals of said solid state switching device to change from a high value to a low value;
   means for connecting said accmulating capacitor to said phase shifting means so as to vary the phase time at which the magnitude of the voltage applied to said gate terminal is sufficient to cause the impedance between the main terminals of said solid state switching device to change from a high value to a low value as an inverse function of the charge stored by said accumulating capacitor;
   means for discharging said accumulating capacitor when said gating switch is changed from the closed position to the open position, said discharge means being connected across said gating switch so as to be inoperative to discharge said accumulating capacitor as long as said gating switch is maintained in the closed position.

2. The apparatus recited in claim 1 wherein said means for discharging said accumulating capacitor comprises:
   a diode;
   a neon indicator lamp connected in series with said diode at a first junction;
   a coupling capacitor connected to said diode-neon indicator circuit at a second junction;
   a resistor operatively connected between said second junction and said accumulating capacitor and;
   means connecting said coupling capacitor, said gating switch and said phase shiftive means together at a third junction.

3. In a circuit connected to an A-C source of the type utilizing an accumulating capacitor to store a charge for varying the phase time at which a series control device is fired for the purpose of gradually applying power to a series connected load, the improvement which comprises:
   a breakdown device having a high impedance range and a low impedance range and;
   a switch having a closed state and an open state;
   means for operatively connecting said breakdown device to said switch, accumulating capacitor and series connected load so as to limit the voltage across said breakdown device to prevent discharge of said accumulating capacitor when said switch is closed and to allow said breakdown device to conduct to progressively discharge said accumulating capacitor during each successive cycle when said switch is opened.

4. A circuit for varying the power applied to a load operated from an A-C source comprising
   a switch having an "on" position and an "off" position;
   a phase shifting network;
   an accumulating capacitor;
   current control means operative connected to said switch, phase shifting network and accumulating capacitor for varying the current applied to the load as a function of the charge stored by said accumulating capacitor;
   means for smoothly and progressively building up a charge on said accumulating capacitor during the first polarity of each successive half cycle of the A-C source following excitation of said switch to the "on" position and;
   means for smoothly and progressively discharging said accumulating capacitor during a second polarity of each half cycle of the A-C source following excitation of said switch to the "off" position.

5. The apparatus recited in claim 4 herein said means for smoothly and progressively charging said accumulating capacitor comprises:
   a charging rectifier;
   impedance means operatively connected in series with said charging rectifier and the A-C source for limiting the amount by which the charge on said accumulating capacitor is incremented during each cycle of the first polarity.

6. The apparatus recited in claim 4 wherein said means for smoothly and progressively discharging said accumulating capacitor comprises:
   a discharging rectifier;
   a non-linear impedance network operatively connected in series with said discharging rectifier and the A-C source for inhibiting the discharge of said accumulating capacitor until the magnitude of the second polarity of the voltage across said current control means exceeds a predetermined value.

7. An apparatus for producing gradual "turn-on" and delayed "turn-off" from either of two locations to which common A-C power lines exist, comprising:
   a first switch having a "C" terminal which can be connected to either of two secondary terminals, said first switch to be located at a first station;
   first diode means connected between said "C" terminal and a first secondary terminal of said first switch and second diode means connected between the second secondary terminal and a first one of the existing A-C lines for producing at the "C" terminal of said first switch a full wave rectified signal of a first polarity when said first switch is positioned so that its "C" terminal contacts its second secondary terminal;
   means connecting said first secondary terminal of said first switch to the second existing A-C line for producing at the "C" terminal of said first switch a signal identical with the voltage on said second existing A-C line when said first switch is positioned so that its "C" terminal contacts its first secondary terminal;
   a second switch having a "C" terminal which can be connected to either of two secondary terminals, said second switch to be located at a second station;
   third diode means connected between said "C" terminal and a first secondary terminal of said second switch, and fourth diode means connected between the second secondary terminal of said second switch and a second one of the existing A-C lines for producing at the "C" terminal of said second switch a full-wave rectified signal of a second polarity when said second switch is positioned so that its "C" terminal contacts its second secondary terminal;
   means connecting said first secondary terminal of said second switch to the first existing A-C line for producing at the "C" terminal of said second switch a signal identical with the voltage on said first existing A-C line when said second switch is positioned so that its "C" terminal contacts its first secondary terminal;
   means for series connecting a soft switch controller and load between the "C" terminal of said first switch and the "C" terminal of said second switch, said soft switch controller to be of type which will gradually "turn-on" when said first and second switches are positioned to impress an A-C or full wave rectified signal across the load and controller, and to gradually "turn-off" when said first and second switches are positioned to impress a half-wave signal across the load and controller.

8. The apparatus recited in claim 7 wherein said soft switch controller comprises:
   a circuit for varying the phase delay of the trigger signal applied to a triac in accordance with the charge on an accumulating capacitor;
   means for maintaining said accumulating capacitor discharged whenever the signal impressed across the series connected load and controller is half wave rectified.

* * * * *